United States Patent
Rapaich

(10) Patent No.: US 6,966,358 B2
(45) Date of Patent: Nov. 22, 2005

(54) PORTABLE AUGMENTED SILENT COOLING DOCKING STATION

(75) Inventor: Mark Rapaich, Westfield, IA (US)

(73) Assignee: Gateway Inc., Irvine, CA (US)

( * ) Notice: Subject to any disclaimer, the term of this patent is extended or adjusted under 35 U.S.C. 154(b) by 0 days.

(21) Appl. No.: 10/765,432

(22) Filed: Jan. 27, 2004

(65) Prior Publication Data

US 2005/0161197 A1    Jul. 28, 2005

(51) Int. Cl.[7] ............................................. F28F 7/00
(52) U.S. Cl. ........................... 165/80.4; 165/104.33; 361/699; 361/687
(58) Field of Search .................. 165/80.4, 104.33, 165/104.34, 80.3, 80.5; 361/687, 697, 698, 361/699, 700; 174/15.2, 16.3; 257/714; 710/303, 710/304

(56) References Cited

U.S. PATENT DOCUMENTS

| | | | |
|---|---|---|---|
| 3,334,684 A * | 8/1967 | Mazorol, Jr. et al. ......... 165/47 |
| 4,072,188 A * | 2/1978 | Wilson et al. ............. 165/80.4 |
| 4,315,300 A * | 2/1982 | Parmerlee et al. .......... 361/703 |
| 4,729,424 A * | 3/1988 | Mizuno et al. ............. 165/261 |
| 5,323,847 A * | 6/1994 | Koizumi et al. ....... 165/104.33 |
| 5,634,351 A | 6/1997 | Larson et al. |
| 5,757,615 A | 5/1998 | Donahoe et al. |
| 5,791,770 A | 8/1998 | Hoyt et al. |
| 6,084,769 A * | 7/2000 | Moore et al. ............... 361/687 |
| 6,181,553 B1 | 1/2001 | Cipolla et al. |
| 6,313,990 B1 | 11/2001 | Cheon |
| 6,434,001 B1 | 8/2002 | Bhatia |
| 6,453,378 B1 | 9/2002 | Olson et al. |
| 6,459,575 B1 | 10/2002 | Esterberg |
| 2004/0008483 A1 * | 1/2004 | Cheon ........................ 361/687 |
| 2005/0122678 A1 * | 6/2005 | Patel et al. ................. 361/687 |

* cited by examiner

Primary Examiner—Tho Duong
(74) Attorney, Agent, or Firm—Jeffrey A. Proehl; Leonard & Proehl, Prof. LLC

(57) ABSTRACT

A system is provided including a cooling station with a fluid reservoir containing a cooling fluid, a circulating pump, and a first fluid circuit including first couplers. A portable computer has a second fluid circuit with second couplers coupling to first couplers thereby coupling the first and second fluid circuits when the portable computer and the cooling station are docked. Fluid is circulated in the first and second fluid circuits when docking is detected. An interface connector, fan, and a controller are further provided, the controller configured to detect docking and activate the circulating pump and de-activate the fan when docking is detected. The fluid includes one or more of: water, ethylene glycol, propylene glycol, and oil.

13 Claims, 4 Drawing Sheets

PORTABLE AUGMENTED SILENT COOLING DOCKING STATION

FIELD OF THE INVENTION

The present invention generally relates to the field of computers such as portable computers, cooling stations, docking stations, and the like, and particularly to liquid cooling systems associated therewith.

BACKGROUND OF THE INVENTION

Until recently, cooling for computers, particularly laptop computers has been primarily accomplished by the use of conduction, natural convection, forced air convection, e.g. through surface dissipation of heat to the environment through heat sinks or enclosure surfaces, through the use of fans, and in many cases, the attachment of fans and heat sinks directly to heat generating components such as processors and the like. However, as processing power and circuit density increase on portable computer systems, cooling requirements may not adequately be met by conventional methods and structures. In addition, a primary heat dissipating surface for a laptop computer, e.g. the underside of the base, is often in direct contact with a work surface and thus is prevented from achieving maximum dissipation or even a predictable degree of dissipation.

In addition, to the extent that forced air systems continue to be used and improved, noise associated not only with fan mechanisms, but with the volume of moving air required to cool advanced processors becomes a problem. Such noise may be acceptable in the mobile computing environment, but in a relatively quiet environment such as an office where, for example, a portable computer may be attached to a docking station for use within the office environment on a desktop, noise levels associated with forced air convection from fans and the like may become unacceptable.

In many systems where heat removal is an important consideration, liquid based cooling systems may be used particularly on major heat generating components such as the display, and the like. In U.S. Pat. No. 5,791,770 issued on Aug. 11, 1998 to Hoyt, et al a cooling device is described for an LCD display the device having a sealed container into which the light source is immersed along with thermally conductive liquid coolant. Drawbacks of such a cooling device might include the lack of ability of the cooling device to address cooling needs of the processor and other heat generating components within the system. To address system wide cooling, U.S. Pat. No. 6,313,990 B1 issued on Nov. 6, 2001 to Cheon, describes a liquid cooling system wherein a pump is used to circulate liquid coolant from a finned reservoir throughout the entire electronic device. Heat absorbed by the liquid coolant is dissipated when a fan circulates ambient air across the reservoir fins. However, as described, the use of a fan is noisy and undesirable in quiet environments such as offices. While typical laptop environments are generally less sensitive to noise; when a laptop is used in an office environment, fan noise would be considered undesirable.

Some laptops or portable computer systems have been equipped with liquid cooling systems. The portable computer described in U.S. Pat. No. 5,634,351 issued on Jun. 3, 1997 to Larson, et al (hereinafter "Larson"), for example, has a two-phase cooling system residing in a base or lid of a portable computer near the circuitry to be cooled. The system of Larson uses passive wicking to circulate liquid throughout the system conserving battery power. Other liquid based cooling systems for portable computers such as that described in U.S. Pat. No. 5,757,615 issued on May 26, 1998 to Donahoe et al., use motor driven pumps to circulate coolant through the system to heat exchangers. Accordingly, it can be appreciated that liquid cooling is an effective means of circulating heat away from heat generating components by absorbing heat into the relatively high heat capacity liquid and circulating the liquid either passively or by pump to a heat exchanger however a complete liquid cooling system within a portable computer adds undesirable weight and bulkiness.

Air convection may also be effective in removing heat and may be simpler in that air may be exhausted into the atmosphere, though it should be noted that air lacks the heat absorbing capacity of many cooling fluids. Fans may further be used to improve the rate of air exchange in a space and control where exhaust air is directed. While fans may be effective in moving heated air from an enclosure or away from the surface of a device or heat sink, other non-liquid, conduction based devices may be used to draw heat from a source where fans are impractical or undesirable for whatever reason.

The simplest mechanical conduction device well known in the art is the heat sink. The heat sink takes advantage of materials with high thermal conduction properties coupled with increased surface area within the area to be cooled. The heat sink is often used in connection with other devices such as fans and the like to remove the heated air which dissipates from the surfaces of the heat sink from an enclosure. As real estate inside portable devices shrink, so does the effectiveness of heat sinks since a heat sink's effectiveness is proportional to the amount of surface area associated with its dissipating surfaces. Another device often used in connection with a heat sink is a heat pipe.

A heat pipe in its simplest form is a thermally conductive material formed into a bar or pipe and often is terminated with a heat sink. Heat pipes may also be more complicated, sealed and filled with liquid or the like. The operation of the heat pipe is to draw heat along its thermally conductive length to a sink area where heat can be safely dissipated such as outside an enclosure or the like. In U.S. Pat. No. 6,459,575 B1 issued on Oct. 1, 2002 to Esterberg, for example, a cooling module is described wherein a heat pipe associated with the cooling module is inserted into a heat sink associated with a device such as a portable computer or the like. Heat is drawn from the heat sink along the heat pipe to the cooling module where the heat is exhausted into the atmosphere using a fan. In other systems, such as that described in U.S. Pat. No. 6,181,553 B1 issued on Jan. 30, 2001 to Cipolla et al, heat may be transferred from a portable computer to a docking station through the use of a heat pipe and heat sinks located in the docking station. In a similar configuration, as described in U.S. Pat. No. 6,434,001 B1 issued on Aug. 13, 2002 to Bhatia, heat pipes connected to heat sinks and associated with a docking station may be removably coupled to heat transfer elements of a portable device. Still further, for example as described in U.S. Pat. No. 6,453,378 B1 issued on Sep. 17, 2002 to Olson et al, a docking station may be provided with active cooling mechanisms such as heat pipes, heat slugs, cooling coils, and the like to transfer heat from the portable computer when docking is detected.

Considering, however, the superior cooling capabilities and low noise qualities of liquid-based cooling systems, it would be desirable in the art for a cooling system which would incorporate the advantages of liquid based cooling in a quiet environment for portable devices.

SUMMARY OF THE INVENTION

Accordingly, the present invention is directed to a cooling station capable of augmenting cooling for a portable computer. In accordance with one embodiment, the cooling station preferably comprises a fluid reservoir containing a fluid for cooling, a circulating pump, and a first fluid circuit. The first fluid circuit preferably includes at least two first couplers to enable to the first fluid circuit to be coupled to a second fluid circuit associated with the portable computer. To facilitate coupling to the first couplers, the second fluid circuit may have at least two second couplers. The cooling station is preferably capable of circulating the fluid when docking is detected between the portable computer and the cooling station and it can be assured that coupling has been made between the first and second fluid circuits. The cooling station may further be equipped with an interface connector and a controller such as a detection circuit coupled to the interface connector. The controller is preferably capable of detecting docking between the cooling station and the portable computer in a suitable manner, and further, of activating the circulating pump when docking is detected. The controller may further de-activate a fan associated with the portable computer when docking is detected. It should be noted that the fluid preferably includes one or more of: water, ethylene glycol, propylene glycol, and oil. To further aid heat transfer, the fluid reservoir may be equipped with cooling fins while the cooling station may include a convection vent such that heat accumulating in the fluid reservoir may be dissipated to the atmosphere via the convection vent.

In accordance with another exemplary embodiment, a portable computer may be provided with augmenting cooling through a first fluid circuit having at least two first couplers which are capable of coupling to at least two second couplers and a second fluid circuit associated with a cooling station when the portable computer is docked thereto. The cooling station preferably includes a fluid reservoir containing a cooling fluid, a circulating pump, and a second fluid circuit coupled to, e.g. in-line with, the circulating pump and the fluid reservoir. The first fluid circuit may be coupled to the second fluid circuit and the fluid may be circulated when docking is detected between the portable computer and the cooling station. The portable computer in accordance with the present invention may further include an interface connector and a fan coupled to the interface connector and the cooling station may further be equipped with a controller coupled to the interface connector, the controller capable of detecting docking between the cooling station and the portable computer, and activating the circulating pump and de-activating the fan when docking is detected. As noted above, the fluid may preferably includes one or more of: water, ethylene glycol, propylene glycol, and oil.

In accordance with still another embodiment, a system for augmenting cooling may be provided including a cooling station having, for example, a fluid reservoir containing a fluid for cooling, a circulating pump coupled to the fluid reservoir, and a first fluid circuit including two first couplers, the circuit coupled to the circulating pump and the fluid reservoir. A portable computer may further be provided having a second fluid circuit with two second couplers coupling to the two first couplers. The first and the second fluid circuits are preferably coupled together and the fluid is capable of being circulated when the portable computer and the cooling station are docked, with, for example, the circulating pump. The system may further include a fan, an interface connector and a controller coupled thereto. The controller may be configured to detect docking between the cooling station and the portable computer and may further activate the circulating pump and de-activate the fan when docking is detected. The fluid may include one or more of: water, ethylene glycol, propylene glycol, and oil.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings. The present invention provides an augmented portable computer and docking station having forced liquid circulation for silent cooling when operating in a docked state.

There have been a number of different approaches taken in trying to provide cooling to various electronic devices. For example, U.S. Pat. No. 5,896,269 issued on Apr. 20, 1999 to Autry and involves a positive pressure heat sink conduit; U.S. Pat. No. 5,927,094 issued on Jul. 27, 1999 to Nickum and involves a cooling apparatus which uses waste heat; and U.S. Pat. No. 6,487,463 issued on Nov. 26, 2002 to Stepp and involves temperature sensors for actively cooling different regions of an electronic device. The Autry patent, the Nickum patent and the Stepp patent, each of which are each assigned to the present assignee, are each hereby incorporated by reference herein in their entirety.

Figure 1:
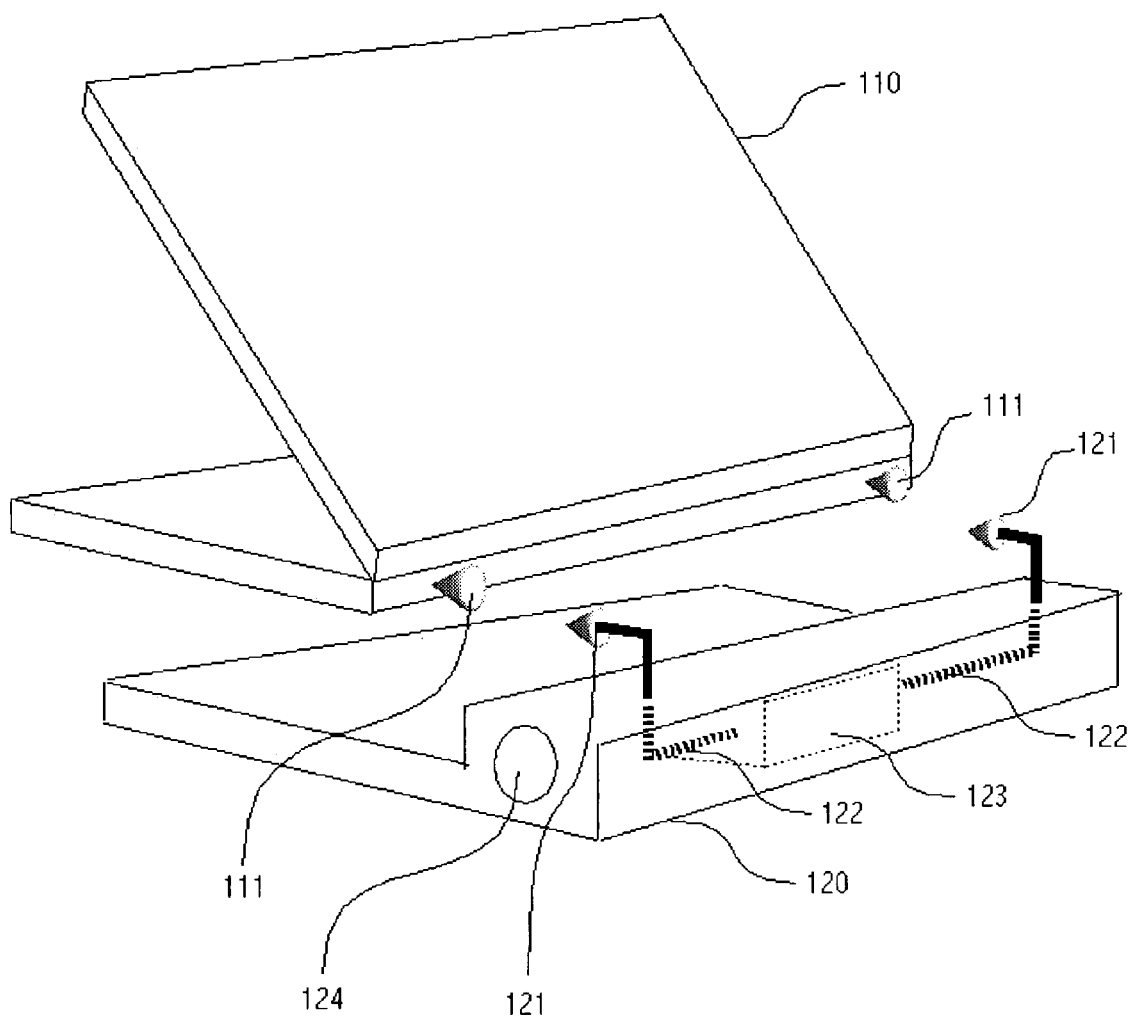
FIG. 1 is diagram illustrating a conventional portable computer system and docking station employing heat pipes, heat sink, and fan.

As described above in the background section, conventional cooling systems for portable computer systems operating in a quiet environment, e.g. have been limited in their capability for silent operation due primarily to the persistent use of fans as the primary means of removing heat from enclosures including docking stations. The use of docking stations for the purpose of docking portable computers systems is known to those of skill in the art. Conventional docking stations which include some features intended to cool personal computers are described in the Cipolla, et al. patent and in U.S. Pat. No. 6,574,102 issued to Usui et al., both of which are hereby incorporated by reference in their entirety. FIG. 1 illustrates scenario 100 wherein conventional portable computer 110 is shown in a pre-docking position to docking station 120. As described in Cipolla, et al., a plug, such as plug 121 may be inserted into socket 111 and heat removed from portable computer 110 via conduction through heat pipes 122 to heat sink 123. Fan 124 may further be used to remove heat from the enclosure of docking station 120. However, fans are undesirable for noise and other reasons as described hereinabove. Therefore a quieter solution would be preferable, e.g. liquid cooling without the use of a fan.

Figure 2:
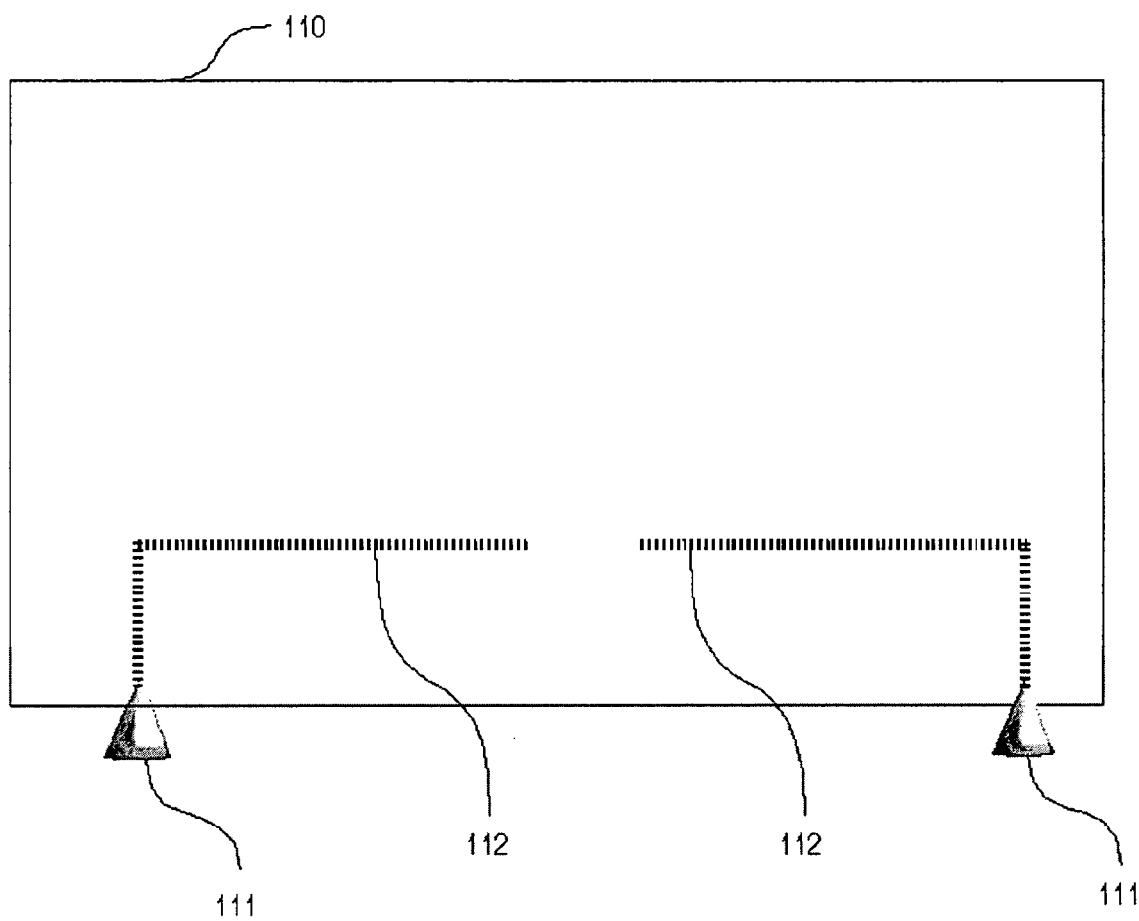
FIG. 2 is diagram further illustrating a conventional portable computer with heat pipe routing.

FIG. 2 further illustrates portable computer 110 and sockets 111 with open ended heat pipes 112 coupled thereto. Problems arise however, in that sockets 111 are cumbersome and, since they protrude from the case of portable computer 110, may snag and possibly break. Further, heat pipes still are relatively limited in capacity thus do not adequately address the growing need for more powerful and faster processors which operate at much hotter temperatures than slower counterparts.

Figure 3:
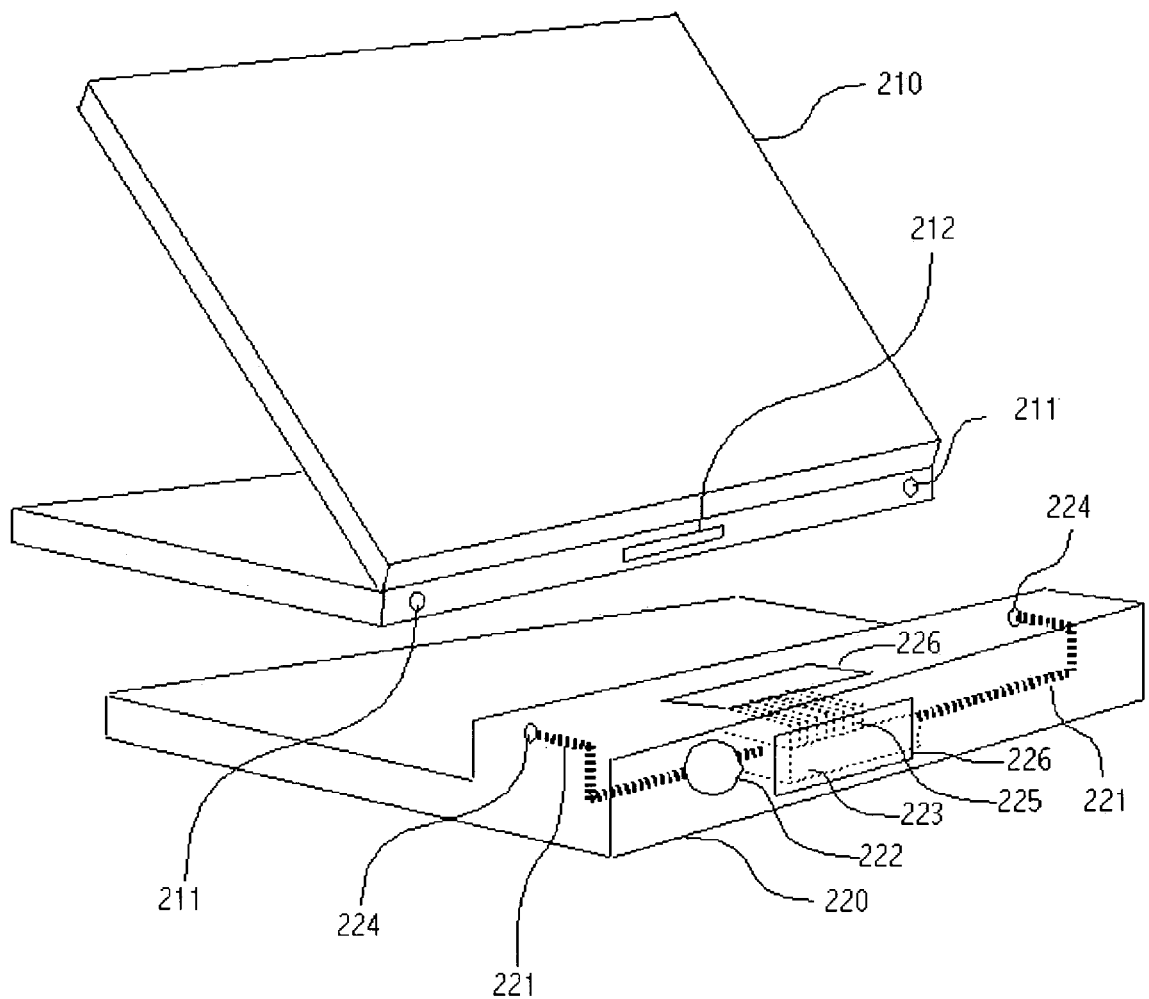
FIG. 3 is diagram of an exemplary portable computer system and docking station with forced liquid circulation in accordance with the present invention.

To address these and other problems associated with conventional cooling approaches, the present invention provides for a closed loop circulating fluid system when a portable computer is docked and most likely to be in an environment where silent operation is desirable. As can be seen in FIG. 3, scenario 200 shows portable computer system 210 with fluid couplers 211 and docking station 220 with corresponding fluid couplers 224 as will be described in greater detail herein after. Docking station 220 may further be provided with circulation pump 222, and cooling reservoir 223 which, while configured to hold reserve cooling fluid, may also act as a heat radiator through the operation of cooling fins 225 and vents 226. Fluid lines 221 may be used to carry a cooling fluid such as water, ethylene glycol, propylene glycol, oil, or other suitable coolant as would be known in the art, and will circulate fluid, for example, when portable computer 210 is in a docked state with docking station 220. It will further be appreciated that in order to properly operate without incident, docking must be sensed prior to activating circulating pump 222, e.g. when interface connector 212 is seated. In accordance with various exemplary embodiments, circulating pump 222 is preferably a small brushless DC magnetic drive circulator operating on voltage levels present in docking station 220. Circulating pump 222, however may also be an AC pump as docking station 220 preferably has access to 110V 60 cycle AC. A main factor in selection of pump 222 is quietness of operation and the ability to be controlled, e.g. turned on and off, with reliability.

Alternatively, sensors can be incorporated into fluid coupler pairs 211/224 such that when coupling is detected, circulating pump 222 may be activated. It will be appreciated that ideally, circulating pump 222 may be configured for quiet operation and may be activated only when a temperature reaches a certain value as could be sensed at one or many places within the system. It will also be appreciated that to prevent fluid leakage, couplers 211 and 224 are preferably equipped with a valve which closes after decoupling. In such a way, fluid remains in each of a first and second fluid circuit associated with cooling or docking station 220 facilitating circulation for the next docking session. It will further be appreciated that couplers 211 and 224 may be of a kind, such as a quick connect-style fluid coupler, or the like, designed for zero or low insertion force and, again, configured to shut off through the operation of a flapper, valve, or the like to prevent fluid leakage. Since such coupling mechanisms are known, details of coupling mechanisms are omitted from the figures.

Figure 4:
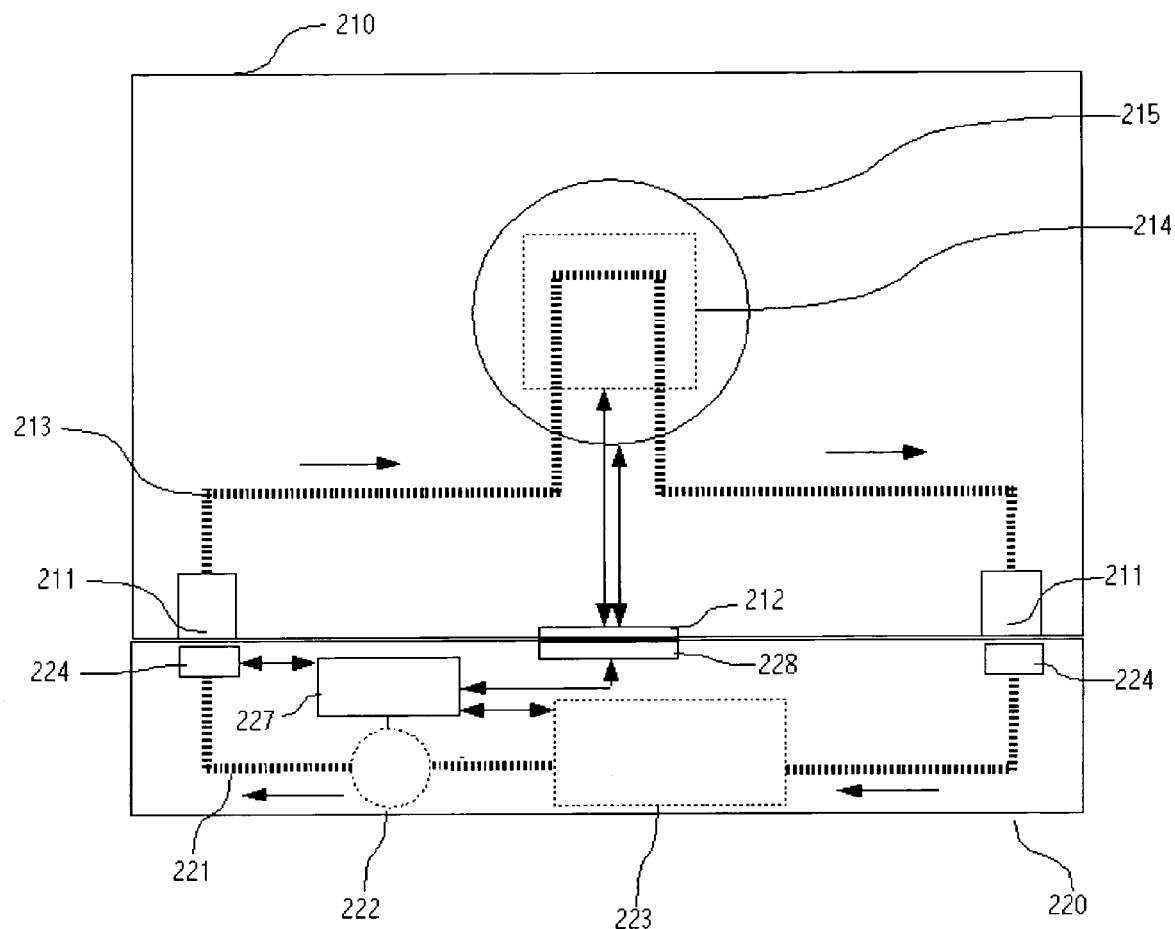
FIG. 4 is diagram of an exemplary portable computer system and docking station with forced liquid circulation in accordance with the present invention.

A more detailed view of portable computer 210 and docking station 220 in accordance with various exemplary and alternative exemplary embodiments is shown in FIG. 4. It can be readily seen that coolant fluid may be circulated using circulating pump 222 along a fluid circuit determined by the routing of fluid lines 213 and once docking occurs, through fluid coupler pairs 211/224 through fluid lines 221 associated with docking station 220. Controller 227, which may include a detection circuit may be used to, inter alia, detect that docking has occurred through one or more of: detecting coupling on fluid coupler pairs 211/224 or detecting docking on interface connector 212/228 and, in response thereto, either activate circulating pump 222 or enable circulating pump 222 for operation once a temperature is sensed, for example, in reservoir 223, and/or processor 214. To complete the establishment of silent operation in accordance with the inventive principles described herein, fan 215 may be disabled once circulation begins.

The use of the term "portable computer" in this description is meant to encompass other similarly used terms such as "laptop computer" and "notebook computer."

It is believed that the portable augmented silent cooling station of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A cooling station capable of augmenting cooling for a portable computer, comprising:
    a fluid reservoir containing a fluid for cooling;
    a circulating pump coupled to the fluid reservoir; and
    a first fluid circuit coupled to the circulating pump and the fluid reservoir, the first fluid circuit including at least two first couplers;
    wherein the first fluid circuit is capable of being coupled to a second fluid circuit associated with the portable computer, the second fluid circuit having at least two second couplers to couple to the at least two first couplers, the cooling station capable of circulating the fluid upon detecting docking between the portable computer and the cooling station;
    an interface connector; and
    a controller coupled to the interface connector, the controller capable of detecting docking between the cooling station and the portable computer, and activating the circulating pump upon detecting docking.

2. A cooling station in accordance with claim 1, wherein the controller is capable of de-activating a fan associated with the portable computer upon detecting docking.

3. A cooling station according to claim 1, wherein the fluid includes one or more of: water, ethylene glycol, propylene glycol, and oil.

4. A cooling station according to claim 1, further including at least one convection vent and wherein the fluid reservoir further includes cooling fins.

5. A portable computer with augmenting cooling, comprising:
    a first fluid circuit having at least two first couplers capable of coupling to at least two second couplers associated with a cooling station, the cooling station including:

a fluid reservoir containing a fluid for cooling;
a circulating pump coupled to the fluid reservoir; and
a second fluid circuit coupled to the circulating pump and the fluid reservoir, the second fluid circuit including the at least two second couplers;
wherein the first fluid circuit associated with the portable computer is capable of being coupled to second fluid circuit associated with the cooling station, the cooling station capable of circulating the fluid upon detecting docking between the portable computer and the cooling station;
an interface connector; and
a fan coupled to the interface connector;
wherein the cooling station further includes a controller coupled to the interface connector, the controller capable of detecting docking between the cooling station and the portable computer, and activating the circulating pump upon detecting docking.

6. A portable computer in accordance with claim 5, wherein the fan is capable of being de-activating by the detection circuit upon detecting docking.

7. A portable computer according to claim 5, wherein the fluid includes one or more of: water, ethylene glycol, propylene glycol, and oil.

8. A system for augmenting cooling, the system comprising:
a cooling station having a fluid reservoir containing a fluid for cooling, a circulating pump coupled to the fluid reservoir, and a first fluid circuit coupled to the circulating pump and the fluid reservoir, the first fluid circuit including at least two first couplers; and
a portable computer having a second fluid circuit with at least two second couplers coupling to the at least two first couplers associated with the cooling station;
wherein the first and the second fluid circuits are coupled together when the portable computer and the cooling station are docked, and wherein the fluid is capable of being circulated in the first and second fluid circuits with the circulating pump upon detecting docking between the portable computer and the cooling station;
wherein the portable computer is characterized by having a clamshell housing with a display portion and a keyboard portion pivotally coupled together.

9. A system in accordance with claim 8, wherein the second fluid circuit is located in the keyboard portion of the clamshell housing of the portable computer.

10. A system in accordance with claim 8, wherein the at least two second couplers are located on the keyboard portion of the clamshell housing of the portable computer.

11. A system for augmenting cooling, the system comprising:
a cooling station having a fluid reservoir containing a fluid for cooling, a circulating pump coupled to the fluid reservoir, and a first fluid circuit coupled to the circulating pump and the fluid reservoir, the first fluid circuit including at least two first couplers; and
a portable computer having a second fluid circuit with at least two second couplers coupling to the at least two first couplers associated with the cooling station;
wherein the first and the second fluid circuits are coupled together when the portable computer and the cooling station are docked, and wherein the fluid is capable of being circulated in the first and second fluid circuits with the circulating pump upon detecting docking between the portable computer and the cooling station:
an interface connector; and
a controller coupled to the interface connector;
wherein the controller is configured to detect docking between the cooling station and the portable computer, and to activate the circulating pump upon detecting docking.

12. A system in accordance with claim 11, further comprising:
a fan associated with the portable computer, the fan coupled to the interface connector and the controller;
wherein the controller is configured to de-activate the fan when docking between the cooling station and the portable computer is detected.

13. A system in accordance with claim 11, wherein the fluid includes one or more of: water, ethylene glycol, propylene glycol, and oil.

* * * * *